United States Patent

[11] 3,619,737

[72] Inventor Te-Long Chiu
Wappingers Falls, N.Y.
[21] Appl. No. 35,785
[22] Filed May 8, 1970
[45] Patented Nov. 9, 1971
[73] Assignee International Business Machines Corporation
Armonk, N.Y.

[54] PLANAR JUNCTION-GATE FIELD-EFFECT TRANSISTORS
10 Claims, 24 Drawing Figs.

[52] U.S. Cl. ........ 317/235 R, 317/235 A, 317/235 AM
[51] Int. Cl. ........ H01l 11/14
[50] Field of Search ........ 317/235 A

[56] References Cited

UNITED STATES PATENTS

| | | | |
|---|---|---|---|
| 3,001,111 | 9/1961 | Chappey | 317/235 |
| 3,398,337 | 8/1968 | So | 317/235 |
| 3,381,188 | 4/1968 | Zuley | 317/235 |

OTHER REFERENCES

Roosild, et al., Proceedings Of The IEEE, July. 1963, pages 1,059- 1,060 (Copy in 317/235 A)

*Primary Examiner*—John W. Huckert
*Assistant Examiner*—Martin H. Edlow
*Attorneys*—Hanifin & Jancin and Martin G. Reiffin

ABSTRACT: A junction-gate field-effect transistor is provided with its channel extending from the source to the drain in a direction normal to the plane of the substrate. The length of the channel is thereby substantially shorter than where the channel extends parallel to the plane of the substrate. The shorter channel provides faster switching speed and increased transconductance of the transistor.

INVENTOR
TE-LONG CHIU

BY Martin G. Reiffin
ATTORNEY

PLANAR JUNCTION-GATE FIELD-EFFECT TRANSISTORS

FIELD OF THE INVENTION

The present invention relates to field-effect transistors wherein the charge carriers flow in a channel from the source to the drain. The rate of flow of these carriers is determined by the voltage applied to gates between which the channel extends. Field-effect transistors in accordance with the present invention are particularly useful in both the logic and memory circuits of computers.

DESCRIPTION OF THE PRIOR ART

Heretofore in the prior art of junction-gate field-effect transistors the channel extended in a direction parallel to the plane of the substrate. As a result, the shortest channel length which could be fabricated without difficulty was about 0.1 mil. This limited the switching speed and the transconductance of the transistor.

SUMMARY OF THE INVENTION

It is therefore a primary object of the present invention to provide a field-effect transistor having a channel extending normal to the plane of the substrate, instead of parallel thereto as heretofore practiced. As a result, the channel length can be made about 0.5 micron or shorter, thereby providing a faster switching speed and higher transconductance as compared with the devices of the prior art.

DESCRIPTION OF THE PREFERRED EMBODIMENT

Figure 2:
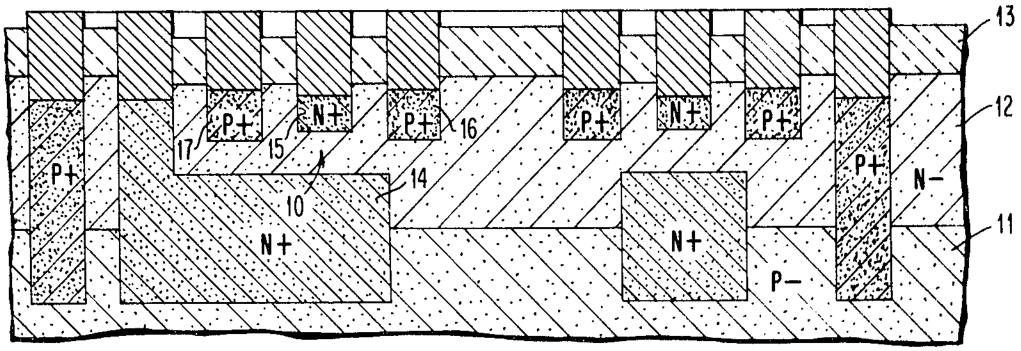
FIG. 2 is a sectional view taken on said line.
Figure 1:
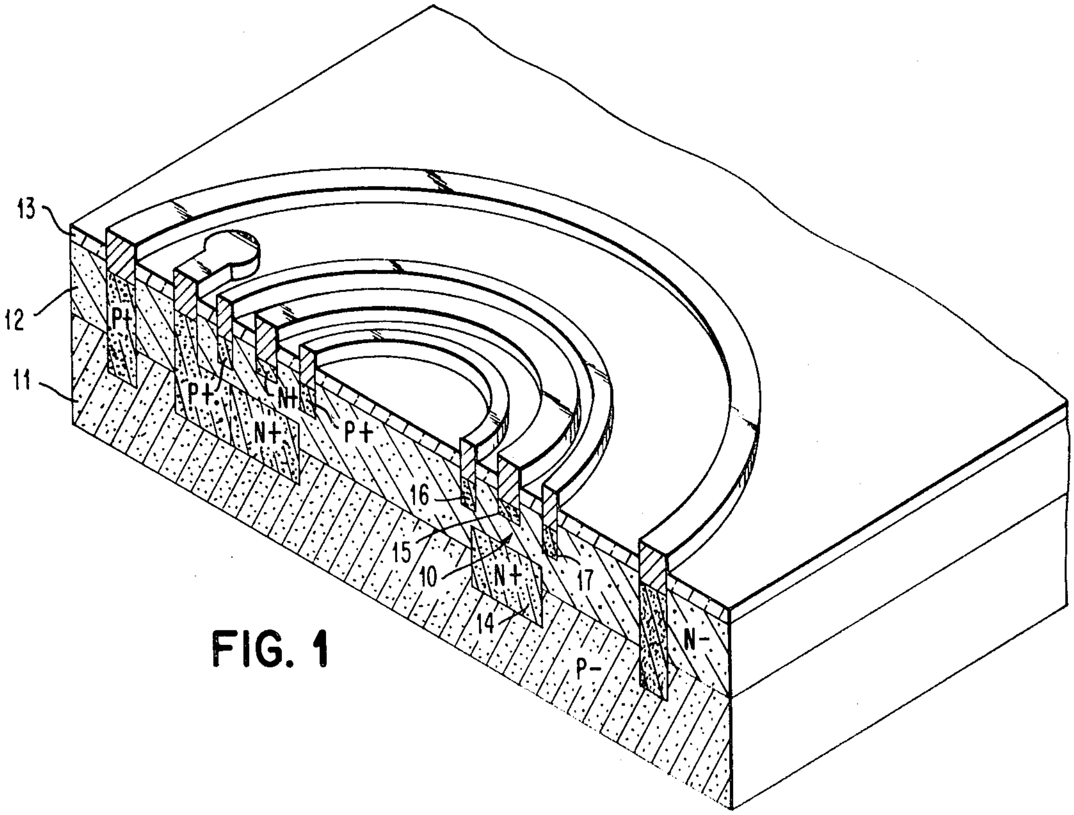
FIG. 1 is a sectional perspective view of a field-effect transistor embodying the present invention and taken on line 1—1 of FIG. 3.

Referring first to FIGS. 1 and 2, there is shown a substrate 11 having formed thereon an epitaxial layer 12 covered by an oxide 13. The source is indicated at 14 and the drain is shown at 15. A channel 10 extends from source 14 to drain 15 and in a direction normal to the plane of the substrate. The channel 10 is bounded at its sides by gates 16 and 17.

Figure 4:
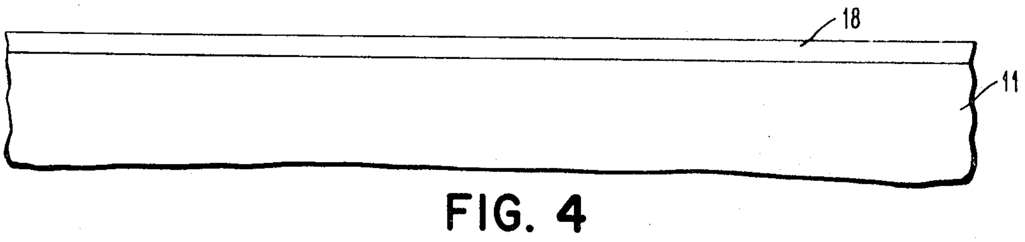
FIGS. 4 to 23 show the successive steps in the method of fabricating the present invention.
Figure 5:
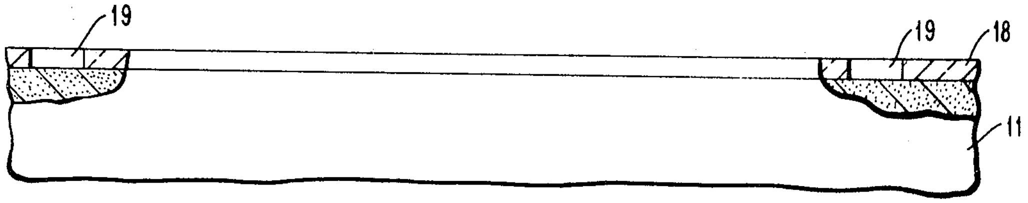

The structural details of the transistor in accordance with the present invention may be best understood from a description of the successive method steps in fabricating the device as shown in FIGS. 4 to 23 inclusive. Referring to FIG. 4, a silicon dioxide layer 18 was first grown on the surface of the substrate 11. In FIG. 5 the oxide has been etched so as to open an annular window 19 which will be used as a diffusion window for the buried isolation.

Figure 6:
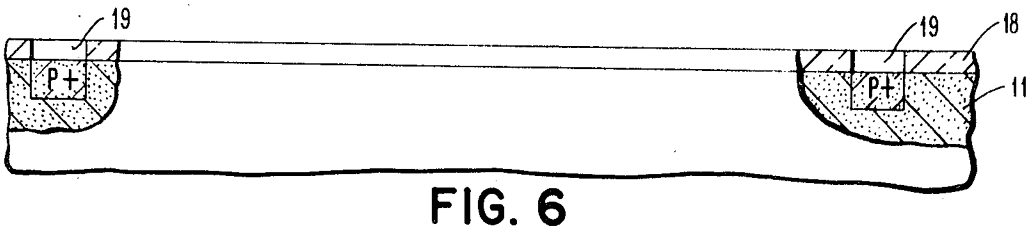
Figure 7:
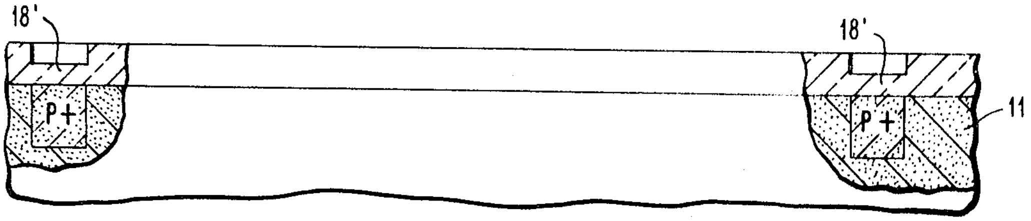
Figure 8:
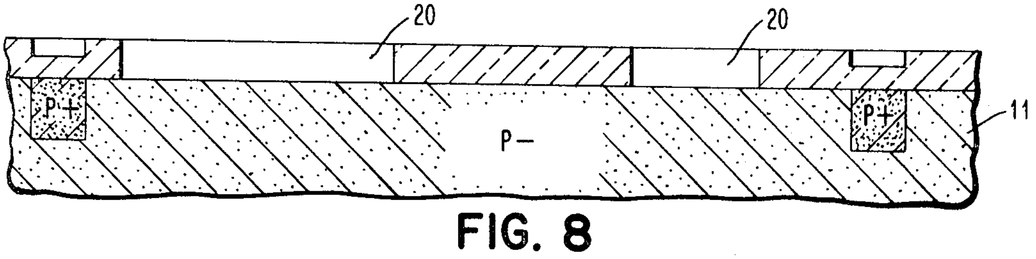
Figure 9:
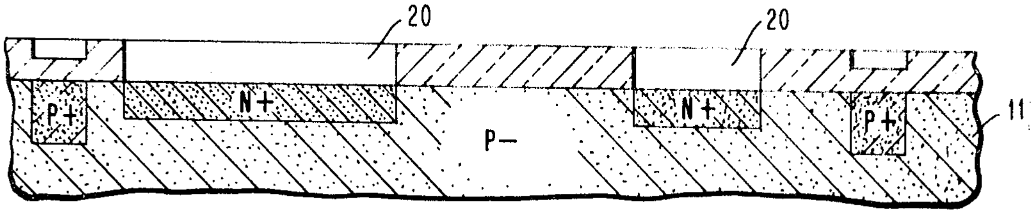

In FIG. 6 a P+ impurity was diffused through window 19 to form the buried isolation. In FIG. 7 an additional layer of oxide 18′ was formed to cover window 19. In FIG. 8 the oxide has been etched to form a diffusion window 20 for the source and the source reach-through. In FIG. 9 an N+ impurity was diffused through window 20 to form the source and the source reach-through.

Figure 10:
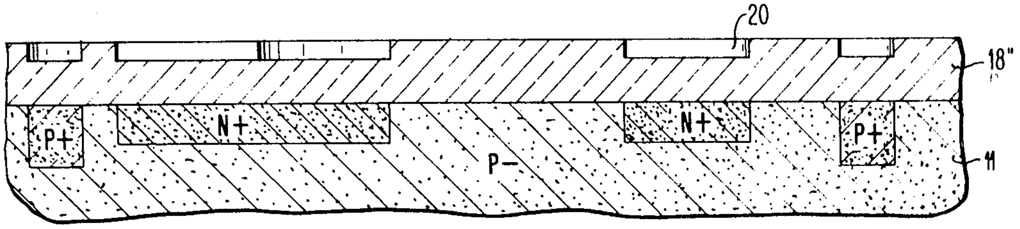
Figure 11:
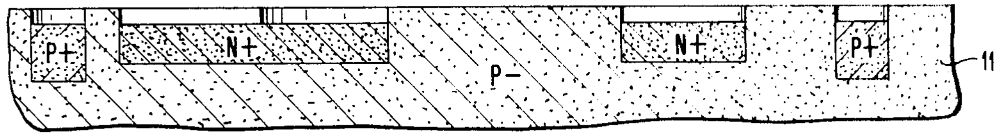
Figure 12:
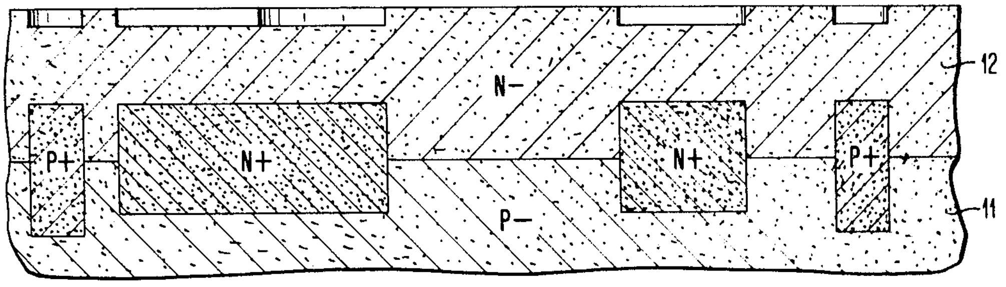
Figure 13:
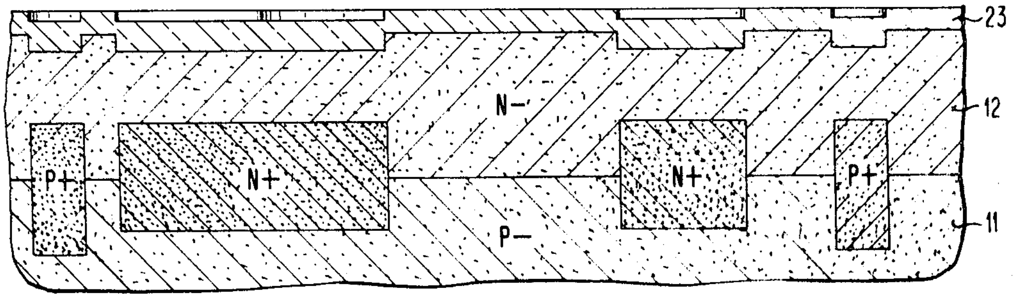

In FIG. 10 an additional layer of oxide 18″ was formed to delineate the shape of and also to cover the window 20. In FIG. 11 all the oxide has been etched away. In FIG. 12 an epitaxial layer 12 has been formed on the upper surface of the substrate 11. In FIG. 13 a layer of oxide 23 has been grown on the surface of the epitaxial layer 12.

Figure 14:
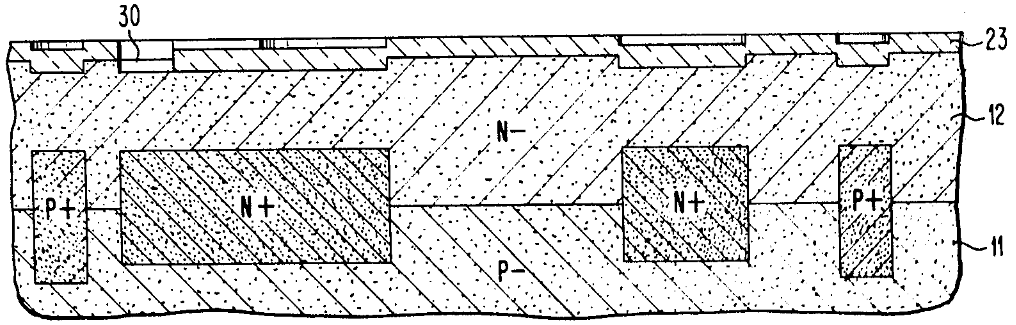
Figure 15:
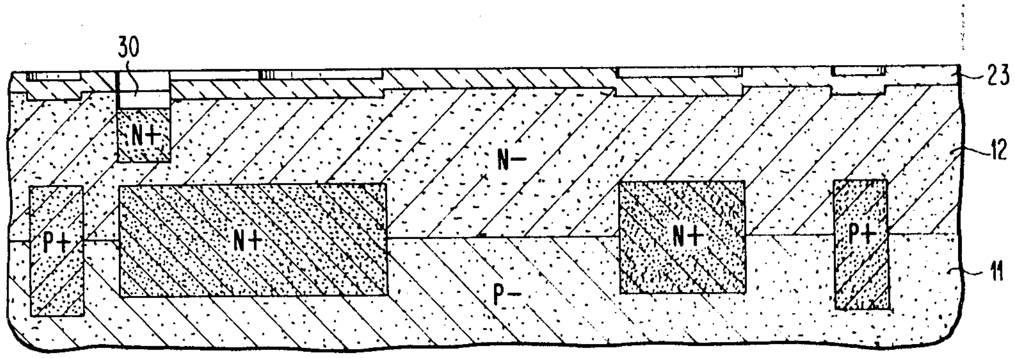
Figure 16:
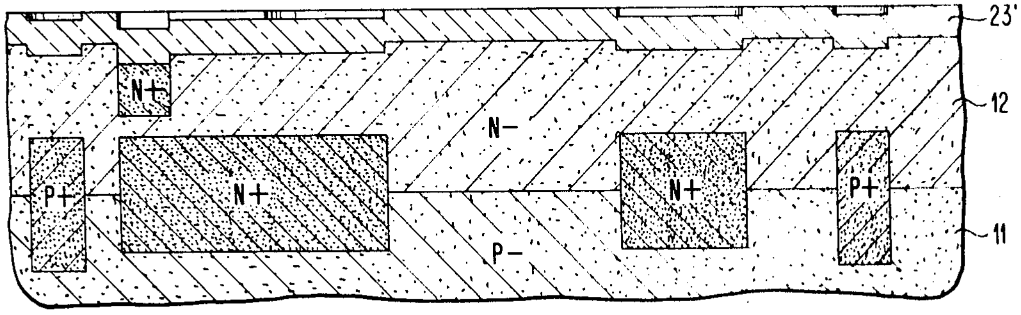

In FIG. 14 part of the oxide 23 has been etched away to form the diffusion window 30 for the source reach-through. In FIG. 15 an N+ impurity has been diffused through window 30 to form the source reach-through. In FIG. 16 an additional layer of oxide 23′ has been grown to cover window 30.

Figure 17:
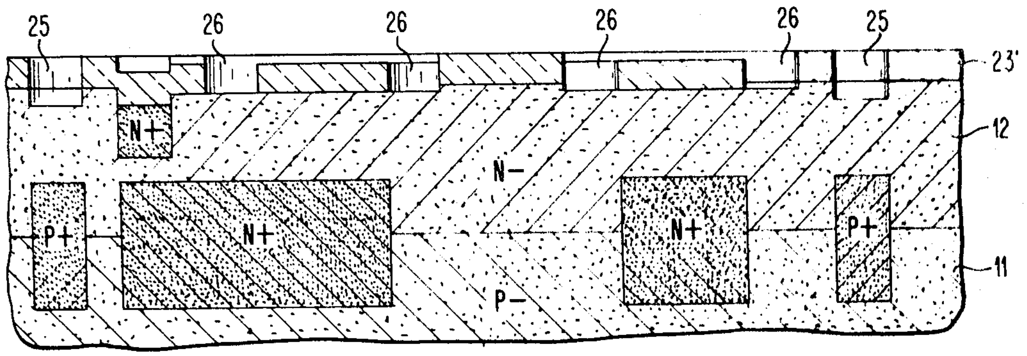
Figure 18:
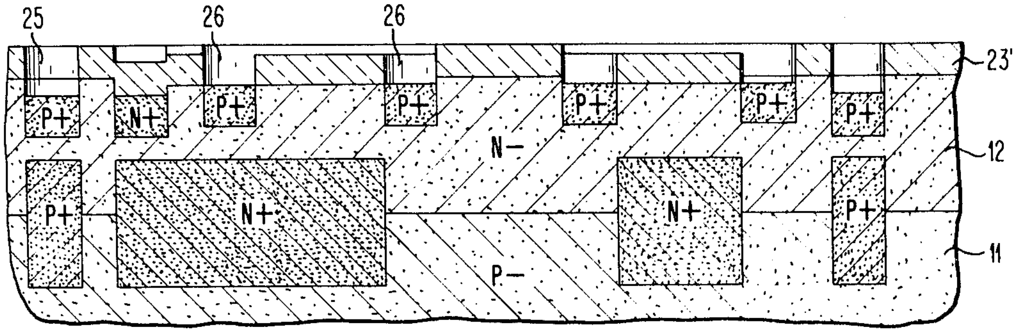
Figure 19:
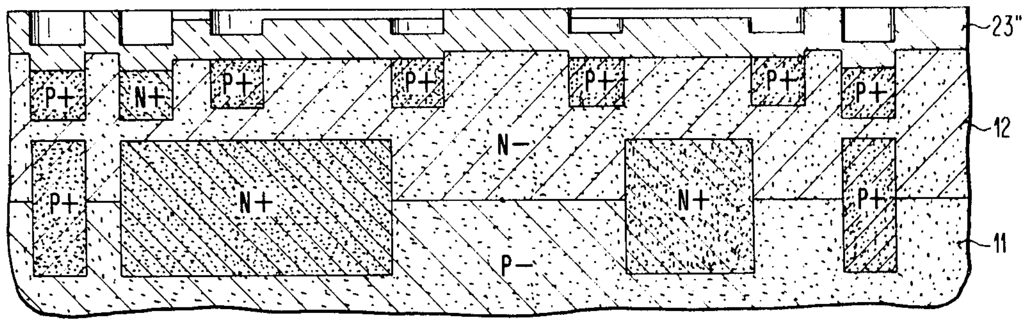
Figure 20:
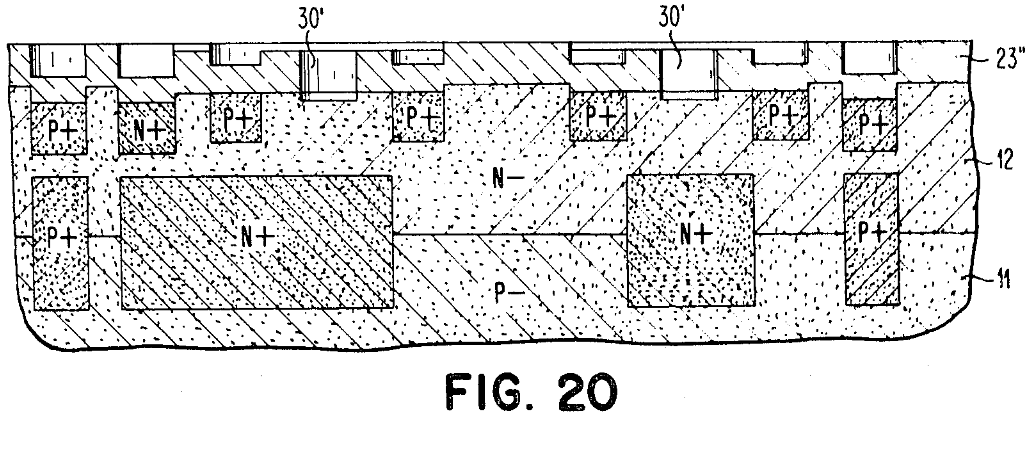
Figure 21:
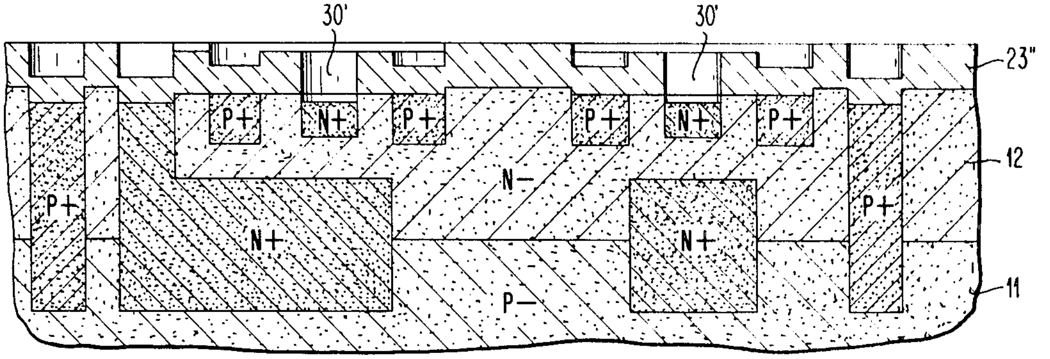

In FIG. 17 part of the oxide has been etched off to form the diffusion windows 25, 26 for the isolation reach-through and the gate. In FIG. 18 a P+ impurity has been diffused through the windows 25, 26 to provide the isolation reach-through and gate. In FIG. 19 an additional layer of oxide 23″ has been formed to cover the windows 25, 26. In FIG. 20 part of the oxide has been etched away to form the diffusion window 30′ for the drain. In FIG. 21 an N+ impurity has been diffused through windows 30′.

Figure 22:
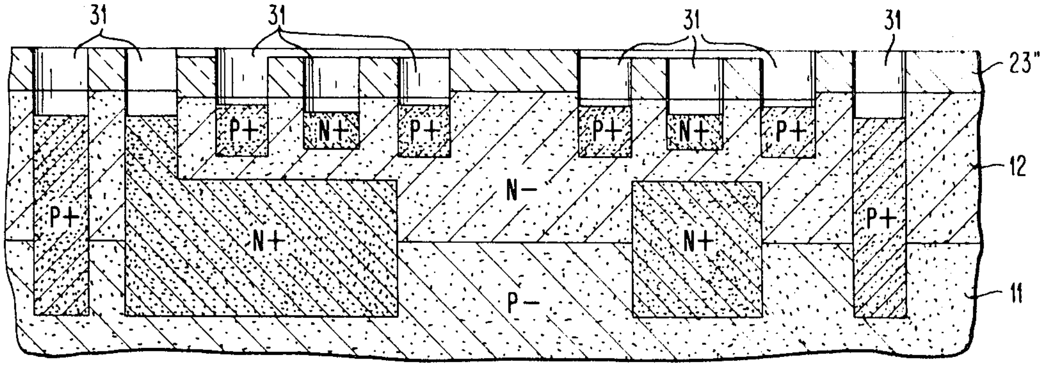
Figure 23:
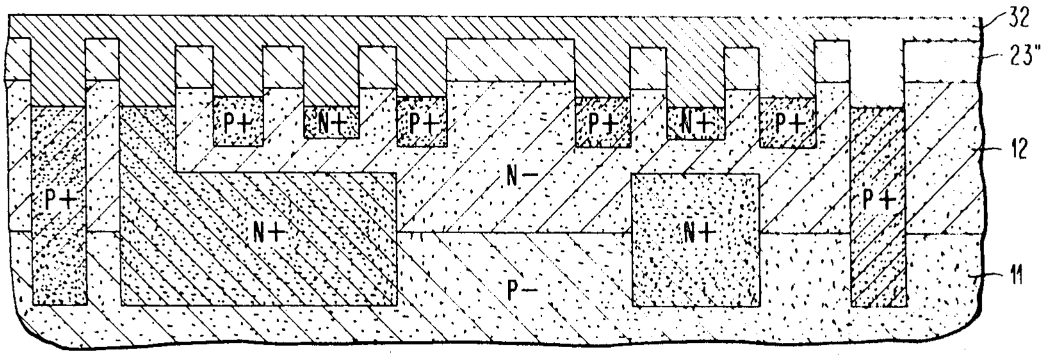

In FIG. 22 part of the oxides 23′ and 23″ have been etched to form windows 31. In FIG. 23 metal 32 has been evaporated on the entire top surface. In FIGS. 1 and 2 the metal 32 has been etched off except where it contacts the diffused regions and where it forms the required conductor network.

As shown in FIGS. 1 and 2 the channel 10 is an annular region concentric with the annular source 14, annular drain 15 and annular gates 16, 17. The channel region 10 is bounded laterally by the gates 16, 17 and extends longitudinally or axially in a direction perpendicular to the plane of the substrate 11. It will be seen that the length of channel 10 in the axial direction may be made arbitrarily short depending on the proximity of the source 14 to the drain 15.

DETAILED DESCRIPTION OF THE PRIOR ART

Figure 24:
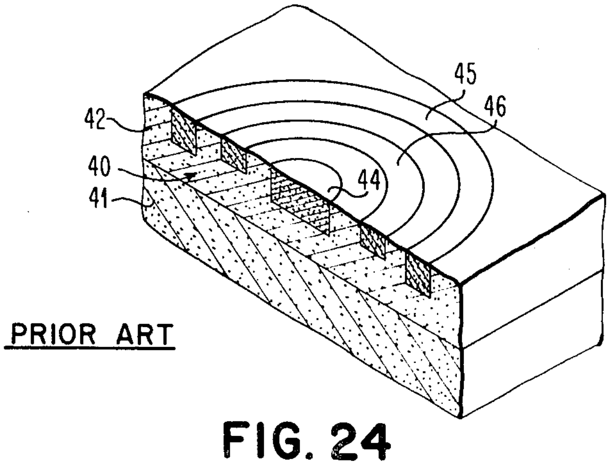
FIG. 24 is a perspective sectional view of a field-effect transistor in accordance with the prior art.
Figure 3:
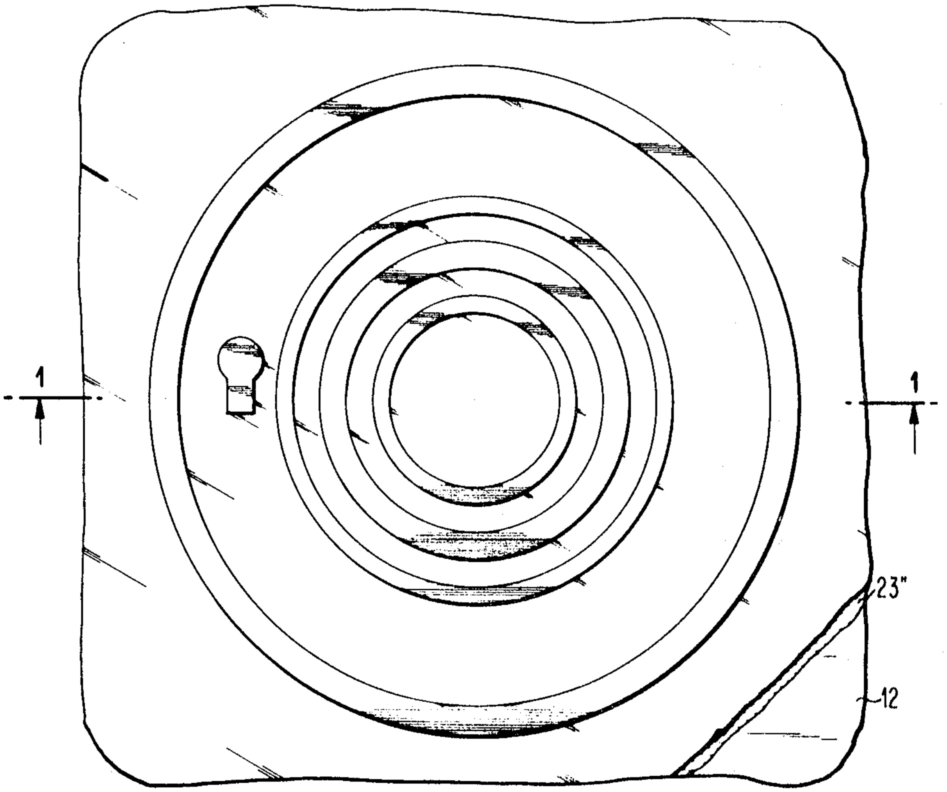
FIG. 3 is a top plan view of the invention.

Referring now to FIG. 24 there is shown a junction gate field-effect transistor in accordance with the prior art. The substrate 41 has formed thereon an epitaxial layer 42. The source is shown at 44 and the drain is shown at 45 so that the channel region 40 extends in a direction parallel with the plane of the substrate 41. The gate 46 controls the flow of carriers in the channel 41.

The length of channel 40 is determined by the distance between source 44 and drain 45. Because of the fabrication technique this distance cannot be less than about 0.1 mil. No such limitation arises in the transistor in accordance with the present invention. The relatively short channel length provided by the present invention is advantageous in that the switching speed is faster and the transconductance larger than in the prior art device in which the channel is parallel to the plane of the substrate.

It is to be understood that the embodiment of the invention disclosed herein is merely illustrative of one of the many forms which the invention may take in practice without departing from the scope of the invention delineated by the claims, and that the claims are to be construed as broadly as permitted by the prior art.

I claim:

1. A field-effect transistor comprising:
   - a planar monolithic semiconductor substrate member,
   - a first gate region,
   - a source region,
   - a second gate region,
   - an epitaxial region having a relatively low doping concentration separating said source region from said gate regions,
   - a drain region,
   - a channel region having its lateral dimension bounded by said two gate regions and extending longitudinally between said source and drain regions, and
   - an isolation region surrounding and isolating said recited regions.

2. A field-effect transistor as recited in claim 1 and wherein said channel region extends longitudinally in a direction substantially perpendicular to said lateral dimension bounded by said two gate regions.

3. A field-effect transistor as recited in claim 2 wherein said channel region extends longitudinally in a direction substantially normal to the plane of the substrate.

4. A planar junction-gate field-effect transistor comprising:
   - a planar semiconductor member having a substantially planar surface,
   - a planar epitaxial layer on said member,
   - a first annular gate region diffused in said layer, an annular source region diffused in said layer and being approximately concentric with said gate region,
a second annular gate region diffused in said layer and being approximately concentric with said source drain,
said epitaxial layer having material of relatively low impurity concentration and extending between and separating said source region from said gate regions,
an annular drain region diffused in said layer and being approximately concentric with said annular regions,
an annular channel region in said member and having a width bounded by said two gate regions and extending axially between said source and drain regions, and
an annular isolation region diffused in said layer and surrounding and isolating said recited regions.

5. A field-effect transistor as recited in claim 4 wherein said channel region extends axially in a direction substantially normal to said planar surface.

6. A field-effect transistor comprising:
a semiconductor substrate doped with an impurity imparting to the substrate a first polarity type,
an epitaxial layer on said substrate,
a first gate region in said layer and doped with an impurity imparting to said gate region said first polarity type,
a source region in said layer and doped with an impurity imparting to the source region a second polarity type,
a second gate region in said layer and doped with an impurity imparting to said second gate region said first polarity type,
said epitaxial layer having material of relatively low impurity concentration and extending between and separating said source region from said gate regions,
an annular drain region in said substrate and said layer and doped with an impurity imparting to said drain region said second polarity type,
a channel region in said layer and having a width bounded by said two gate regions and extending longitudinally between said source and drain regions, and
an isolation region surrounding and isolating said recited regions.

7. A field-effect transistor as recited in claim 6 wherein said channel region extends in a longitudinal direction substantially normal to said width bounded by said two gate regions.

8. A planar junction gate field-effect transistor comprising:
a semiconductor substrate having a substantially planar configuration and doped with an impurity imparting to the substrate a first polarity type,
an epitaxial layer formed on said substrate and doped with an impurity imparting to the layer a second polarity type opposite to said first polarity type,
a first annular gate region diffused in said layer and doped with an impurity imparting to said gate region said first polarity type,
an annular source region diffused in said layer and being approximately concentric with said region and doped with an impurity imparting to the source region said second polarity type,
a second annular gate region diffused in said layer and being approximately concentric with said source region and doped with an impurity imparting to said second gate region said first polarity type,
said epitaxial layer having material of relatively low impurity concentration and extending between and separating said source region from said gate regions,
an annular drain region diffused in said layer and doped with an impurity imparting to said drain region said second polarity type,
an annular channel region in said layer and having a width bounded by said two gate regions and extending axially between said source and drain regions in a direction approximately normal to the plane of said substrate, and
an annular isolation region diffused in said layer and surrounding and isolating said recited regions.

9. A planar junction-gate field-effect transistor comprising:
a planar semiconductor substrate having a planar configuration and doped with an impurity imparting to the substrate a first polarity type,
a planar epitaxial layer formed on said substrate and doped with an impurity imparting to the layer a second polarity type opposite to said first polarity type,
a first gate region formed in said layer and doped with an impurity imparting to said gate region said first polarity type,
a source region formed in said layer and doped with an impurity imparting to the source region said second polarity type,
a second gate region diffused in said layer and doped with an impurity imparting to said second gate region said first polarity type,
said epitaxial layer having material of relatively low impurity concentration and extending between and separating said source region from said gate regions,
A drain region formed in said layer and doped with an impurity imparting to said drain region said second polarity type,
an annular channel region in said layer and having a width bounded by said two gate regions, and
an isolation region surrounding and isolating said recited regions.

10. A transistor as recited in claim 9 wherein said channel region extends longitudinally in a direction approximately normal to the plane of the substrate.

* * * * *